United States Patent [19]
Moriyama

[11] Patent Number: 5,962,917
[45] Date of Patent: Oct. 5, 1999

[54] SEMICONDUCTOR DEVICE PACKAGE HAVING END-FACE HALVED THROUGH-HOLES AND INSIDE-AREA THROUGH-HOLES

[75] Inventor: Yoshifumi Moriyama, Tokyo, Japan

[73] Assignee: NEC Corporation, Tokyo, Japan

[21] Appl. No.: 09/050,940

[22] Filed: Mar. 31, 1998

[30] Foreign Application Priority Data

Mar. 31, 1997 [JP] Japan .................................. 9-080003

[51] Int. Cl.⁶ .......................... H01L 23/48; H01L 23/02; H01L 23/52
[52] U.S. Cl. .......................... 257/697; 257/693; 257/738; 257/698; 257/678
[58] Field of Search .................................... 257/693, 697, 257/698, 678, 701, 702, 703, 737, 738

[56] References Cited

U.S. PATENT DOCUMENTS

| | | | |
|---|---|---|---|
| 2,971,138 | 2/1961 | Meisel et al. | 257/697 |
| 4,691,225 | 9/1987 | Murakami et al. | 257/693 |
| 5,216,278 | 6/1993 | Lin et al. | 257/688 |
| 5,241,133 | 8/1993 | Mullen, III et al. | 174/52.4 |
| 5,729,437 | 3/1998 | Hashimoto | 257/693 |
| 5,796,170 | 8/1998 | Marcantonio | 257/691 |

FOREIGN PATENT DOCUMENTS

| | | | |
|---|---|---|---|
| 61-53746 | 3/1986 | Japan | 257/693 |
| 2-82557 | 3/1990 | Japan | 257/698 |
| 5-13611 | 1/1993 | Japan | 257/698 |
| 5-327157 | 12/1993 | Japan . | |
| 5-335437 | 12/1993 | Japan | 257/693 |
| 5-335438 | 12/1993 | Japan | 257/693 |

*Primary Examiner*—David B. Hardy
*Assistant Examiner*—Jhihan B. Clark
*Attorney, Agent, or Firm*—Foley & Lardner

[57] ABSTRACT

A semiconductor device package comprises a circuit substrate, a semiconductor device chip mounted on the circuit substrate, a plurality of end-face halved through-holes formed on an end-face of the circuit substrate, in the form obtained by halving a through hole along its center axis, and having an inner side surface coated with a conductor film, a plurality of wiring conductors formed on an upper surface of the circuit substrate and connected to the end-face halved through-holes, a plurality of external electrode conductors formed on a lower surface of the circuit substrate and connected to the end-face halved through-holes, and a solder resist provided to partially cover the external electrode conductors for separating an end of the external electrode conductors from the end-face halved through-holes. The semiconductor device package further includes a plurality of inside-area through-holes formed in an area of the circuit substrate other than the end-face of the circuit substrate, a plurality of additional external electrode conductors formed on the other surface of the circuit substrate and connected to the inside-area through-holes, and an additional solder resist provided to partially cover the additional external electrode conductors for separating an end of the additional external electrode conductors from the inside-area through-holes.

10 Claims, 3 Drawing Sheets

30 ENCAPSULATING RESIN
37 SEMICONDUCTOR DEVICE CHIP
33 END FACE HALVED THROUGH-HOLE ELECTRODE
31 CIRCUIT SUBSTRATE

40 ENCAPSULATING RESIN
47 SEMICONDUCTOR DEVICE CHIP
42 WIRING CONDUCTOR
11a THROUGH-HOLE
41 CIRCUIT SUBSTRATE
BONDING WIRE 48
LOWER SURFACE CONDUCTOR 45
44 SOLDER RESIST
46 SOLDER PROJECTION ELECTRODE

SEMICONDUCTOR DEVICE PACKAGE HAVING END-FACE HALVED THROUGH-HOLES AND INSIDE-AREA THROUGH-HOLES

BACKGROUND OF THE INVENTION

1. Field of the Invention

The present invention relates to a semiconductor device, and more specifically to a semiconductor device package composed of an semiconductor device chip mounted on a circuit substrate having a plurality of external electrodes formed thereon.

2. Description of Related Art

Referring to FIG. 1, there is shown a diagrammatic sectional view of one example of the prior art semiconductor device package. The shown prior art example includes a semiconductor device chip 37 mounted on a circuit substrate 31 and encapsulated with a resin 30. A plurality of end-face through-hole electrodes 33 in the form obtained by axially halving a circular solid column at its center axis, are formed at each end face of the rectangular substrate 33. This type of semiconductor device package is known as a LCC or LLCC (leadless chip carrier) type package. This LCC package is disclosed by for example Japanese Patent Application Pre-examination Publication No. JP-A-05-327157 (the content of which is incorporated by reference in its entirety into this application, and also an English abstract of JP-A-05-327157 is available from the Japanese Patent Office and the content of the English abstract of JP-A-05-327157 is also incorporated by reference in its entirety into this application). In this example, the end-face electrodes are formed by halving the end-face through holes of a ceramic multilevel interconnection substrate. At the time of mounting this type package on a circuit board, the mounting and an electrical connection are realized by forming a solder wetted surface extending from an inner surface of the end-face halved through-hole to a rear face electrode of the package, by use of a solder mainly composed of lead-tin (Pb—Sn) alloy. In another example, a printed circuit board is used as the substrate.

Referring to FIG. 2, there is shown a diagrammatic sectional view of a further example of the prior art semiconductor device package. A semiconductor device chip 47 is mounted on a circuit substrate 41 and is encapsulated with a resin 40. Wiring conductors 42 formed on an upper surface of the substrate 41 and connected to the semiconductor device chip 47 through bonding wires 48, are electrically connected to conductors 45 formed on a lower surface of the substrate 41 by through holes 11a formed to penetrate the substrate 41. A solder resist 44 is partially coated on the lower surface conductors 45 to confine a solder repelling area, and on the other hand, a solder is deposited on an inner end of each of the lower surface conductors 45, to form a solder projection electrode 46 as an external electrode at the inner end of each lower surface conductor 45. When the solder projection electrode 46 is formed, since a solder ball is used, this package is recently well known as a BGA (ball grid array) package.

In the prior art semiconductor device package shown in FIG. 1, since the substrate end-face electrodes are formed on only the periphery of the substrate, the number of electrodes provided in the package is liable to come short. In the case of attempting to increase the number of electrodes, the pitch of the end-face electrodes must be narrowed. However, this is difficult since the spacing between adjacent end-face electrodes must be sufficiently ensured because the end-face electrodes is wettable to solder. In addition, if the spacing between adjacent end-face electrodes is narrowed, since the end-face electrodes is wettable to solder, the packaging also becomes difficult.

On the other hand, in the BGA type semiconductor device package shown in FIG. 2, it is necessary to ensure a minimum electrode pitch when the external electrodes are formed of the solder ball and the package is mounted on a printed circuit board. Therefore, at the time of attempting to increase the number of electrodes, it becomes difficult to miniaturize the package.

SUMMARY OF THE INVENTION

Accordingly, it is an object of the present invention to provide a semiconductor device package which has overcome the above mentioned defects of the conventional ones.

A second object of the present invention is to provide a semiconductor device package having the package size smaller than that of the semiconductor device package having the end-face electrodes and that of the BGA type semiconductor device package.

A third object of the present invention is to provide a semiconductor device package having the number of formable vias larger than that of the semiconductor device package having the end-face electrodes and that of the BGA type semiconductor device package.

A fourth object of the present invention is to provide a semiconductor device package having a high degree of freedom in layout of internal interconnections, and capable of easily designing a multi-chip package having a plurality of semiconductor device chips mounted in a single package.

A fifth object of the present invention is to provide a semiconductor device package capable of protecting a circuit substrate supporting a semiconductor device chip thereon.

The above and other objects of the present invention are achieved in accordance with the present invention by a semiconductor device package comprising a circuit substrate, at least one electronic component (including a semiconductor device chip) mounted on the circuit substrate, a plurality of end-face halved through-holes formed on an end face of the circuit substrate, in the form obtained by halving a through hole along its center axis, and having an inner side surface coated with a conductor film, a plurality of wiring conductors formed on one surface of the circuit substrate and connected to the end-face halved rough-holes, a plurality of external electrodes formed on the other surface of the circuit substrate and connected to the end-face halved through-holes, and a conductor protecting layer provided to cover a region between an inner end of the external electrodes and the end-face halved through-holes for separating the inner end of the external electrodes from the end-face halved through-holes.

With the above mentioned arrangement, since the inner side surface of the end-face halved through-holes coated with the conductor film is not used as an electrically connecting contact face, and since the external electrodes are formed on the other surface of the circuit substrate and connected to the end-face halved through-holes, and furthermore, since the circuit substrate at the outside of the end-face halved through-holes is cut off or removed, the package can be made small.

In addition, since a conventional through hole, called an inside-area through-hole in this specification, needs a land formed to completely surround the through hole, the inside-area through-holes must be formed with a sufficient interval.

However, in the case of the end-face halved through-holes, since the land can be restricted to a width of a wiring conductor extending toward an inside area of the circuit substrate, the necessary area of the land can be reduced. Therefore, by adopting the end-face halved through-holes, an occupying area per one via can be made small. Furthermore, since the vias formed in the form of the end-face halved through-holes and concentrated at the end face of the substrate, the degree of freedom in designing the conductor pattern layout in the inside area of the circuit substrate can be elevated.

In addition, since the end-face halved through-holes can be arranged at a pitch smaller that of the inside-area through-holes, the number of vias can be increased. Furthermore, since the conductor protecting layer separates the end of the external electrodes from the end-face halved through-holes or the inside-area through-holes, the solder is prevented from crawling up on the through-hole inside surface when the package is mounted on a printed circuit board or another circuit board by means of a solder. Therefore, the end-face halved through-holes can be arranged at a pitch smaller that of the prior art semiconductor device package having the end-face electrodes wettable to solder. This means that the number of the end-face halved through-holes can be increased in comparison with the prior art semiconductor device package having the end-face electrodes wettable to solder. Accordingly, the conductor protecting layer is preferably formed of a solder repellent material, which is typified by epoxy resin. In this connection, the end of each of the external electrodes is formed in the shape of a pad, and a bump solder electrode is formed on the end of each of the external electrodes.

In a preferred embodiment, the semiconductor device package further includes a plurality of inside-area through-holes formed in an area of the circuit substrate other than an end face region of the circuit substrate, a plurality of additional external electrodes formed on the other surface of the circuit substrate and connected to the inside-area through-holes, and an additional conductor protecting layer provided to cover a region between an end of the additional external electrodes and the inside-area through-holes for separating the end of the additional external electrodes from the inside-area through-holes.

In this preferred embodiment, since not only the end-face halved through-holes, which can be arranged at a pitch smaller that of the inside-area through-holes, are provided at the end face of the circuit substrate, but also the inside-area through holes are provided in an inside area of the circuit substrate, the number of vias can be remarkably increased.

In other words, this means that since many end-face halved through-holes can be provided along four sides of a rectangular circuit substrate, the number of the inside-area through-holes provided in the inside area of the circuit substrate can be reduced to a necessary and sufficient number. Therefore, this is very effective in the case that the inside-area through-holes make it difficult to provide an electrode for connecting an electric parts or component within the package and/or to lay out a wiring conductor in the inside area of the circuit substrate. Specifically, this is remarkably advantageous in a multilevel interconnection substrate and in a multi-chip package having a plurality of semiconductor device chips mounted in a single package because the number of the inside-area through-holes or vias provided in the inside area of the circuit substrate can be minimized. Particularly, when a plurality of semiconductor device chips are mounted in a single package, it becomes difficult to form many through holes in the inside area of the circuit substrate, since it is not preferable to form the through holes in a region on which each chip is mounted, and since it becomes complicated to lay out wiring conductors connecting between chips and between each chip and external electrodes. On the other hand, the larger the number of semiconductor device chips mounted in a single package becomes, the larger the number of necessary external electrodes becomes. Therefore, the advantage of the present invention can be effectively and remarkably exerted in the multi-chip package.

In a more preferred embodiment, the conductor protecting layer coating the neighborhood of the end-face halved through-holes, extends to cover a portion or the whole of the inner side surface of each of the end-face halved through-holes. When through holes are halved by means of a mechanical cutting tool to form the end-face halved through-holes, if the cutting tool does not have a satisfactory cutting quality, the conductor film coating the inner side surface of the through holes is subjected to an excessive stress, and is often partially peeled off. However, if the end-face halved through-holes, namely, the conductor film coating the inner surface of the through holes, are previously coated with the conductor protecting layer, even if the cutting tool does not have a satisfactory cutting quality, the conductor film coating the inner surface of the through holes is protected with the conductor protecting layer, so that the peeling-off of the conductor film coating the inner surface of the end-face halved through-holes can be avoided.

As seen from the above, the above mentioned end-face halved through-holes can exert the function of the conventional through hole, namely, the function of electrically connecting between the conductor layers respectively formed on the upper and lower surfaces of the circuit substrate, or between the conductor layers of different levels, but also can make the layout of interconnection patterns internally provided in the circuit substrate efficient and free. This is effective in miniaturizing the package.

The above and other objects, features and advantages of the present invention will be apparent from the following description of preferred embodiments of the invention with reference to the accompanying drawings.

DESCRIPTION OF THE PREFERRED EMBODIMENTS

Figure 1:
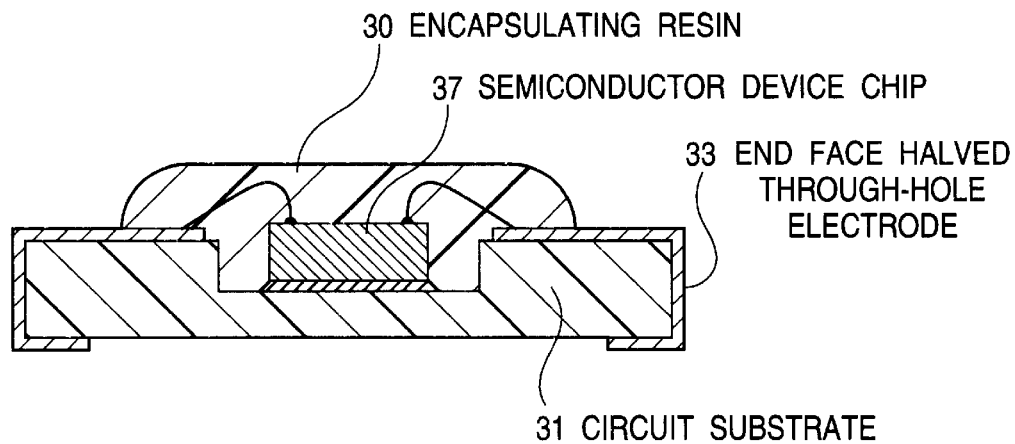
FIG. 1 is a diagrammatic sectional view of one example of the prior art semiconductor device package.
Figure 2:
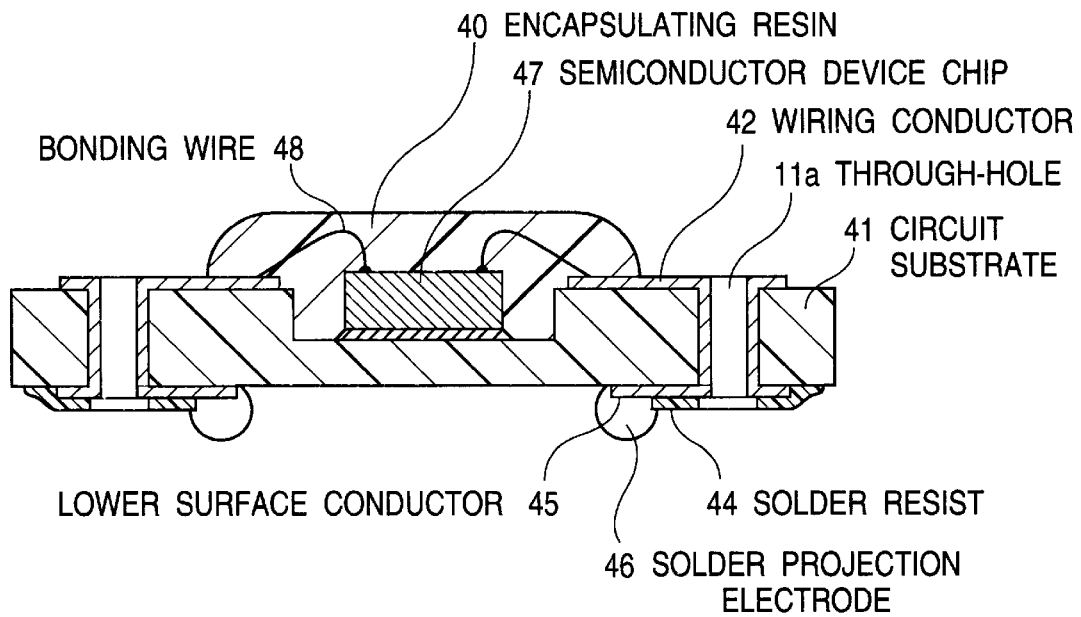
FIG. 2 is a diagrammatic sectional view of a further example of the prior art semiconductor device package.
Figure 3:
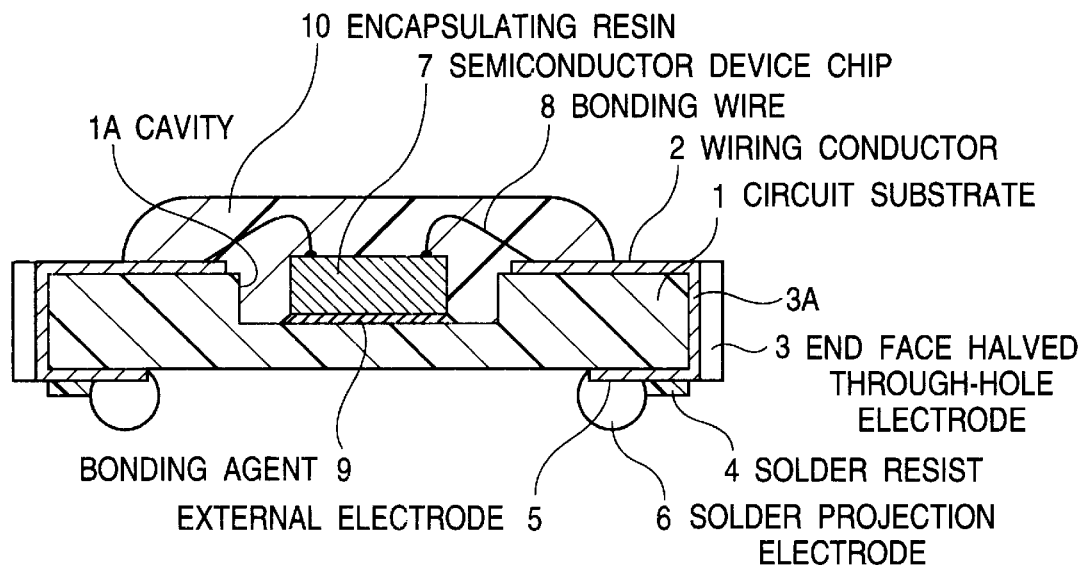
FIG. 3 is a diagrammatic sectional view of a first embodiment of the semiconductor device package in accordance with the present invention.

Referring to FIG. 3, there is shown a diagrammatic sectional view of a first embodiment of the semiconductor device package in accordance with the present invention.

A semiconductor device chip 7 is mounted at a center zone of an upper surface of a rectangular circuit substrate 1 by action of a bonding agent 9. A plurality of wiring conductors 2 are formed on a peripheral zone of the upper surface of the circuit substrate 1, and are electrically connected to the semiconductor device chip 7 by means of bonding wires 8. In order to realize a small-sized, thin package, a cavity 1A for accommodating the semiconductor device chip 7 can be preferably formed at the center zone of the upper surface of the circuit substrate 1, as shown in FIG. 3. The semiconductor device chip 7 mounted on the circuit substrate 1 is encapsulated with an encapsulating resin 10, which is conventionally an epoxy resin, a phenolic resin, or a silicone resin. For realizing a high density, the circuit substrate 1 is formed of an organic wiring substrate material such as a glass-epoxy, a modified polyimide, but can be effectively formed of a ceramic substrate.

End-face halved through-holes 3 in the form obtained by axially halving a through hole along its center axis, are formed at a predetermined constant pitch at each of four end faces of the rectangular circuit substrate 1. An inner side surface of the end-face halved through-holes 3 are coated with a conductor film 3A extending from an upper end to a lower end of the end-face halved through-hole 3. The conductor film 3A is connected, at the upper end of the end-face halved through-holes 3, to a corresponding one of the wiring conductors 2 formed on the upper surface of the circuit substrate 1, and at the lower end of the end-face halved through-hole 3, to a corresponding one of external electrodes 5 formed on a lower surface of the circuit substrate 1. A solder resist 4 is applied to cover the external electrode 5 between the lower end of the end-face halved through-hole 3 and an inner end of the external electrode 5, in order to separate the lower end of the end-face halved through-hole 3 from the inner end of the external electrode 5, thereby to prevent a solder applied between the inner end of the external electrodes and for example a printed circuit board when the package is mounted on the printed circuit board, from crawling up on the inside surface of the end-face halved through-holes 3.

As mentioned above, in the case of mounting the above mentioned semiconductor device package on a printed circuit board, it is in many cases that the external electrodes 5 are connected to the printed circuit board by means of a solder. For this purpose, a solder projection electrode 6 in the form of a bump can be formed on the inner end of the external electrode 5. In this case, the inner end of the external electrodes 5 is preferably in the form of a pad.

The solder resist 4 for separating between the lower end of the end-face halved through-hole 3 and the inner end of the external electrode 5 or the solder projection electrode is preferably formed of a thermoset or ultraviolet-curing epoxy resin. However, any resin material having a solder masking or repelling effect can be used.

Next, the structure of the first embodiment of the semiconductor device package will be described in more detail.

In the embodiment shown in FIG. 3, if the circuit substrate 1 is formed of a glass-epoxy substrate having a thickness on the order of 0.4 mm to 0.8 mm, the diameter of a through hole for the end-face halved through-hole 3 formed at each end face of the substrate is on the order of 0.2 mm to 0.4 mm. In this case, the width of a conductor extending from the lower end of the through hole to reach the external electrode 5 becomes on the order of 0.3 mm to 0.5 mm, because the conductor extending from the through hole is required to have a width larger than the diameter of the through hole, in order to protect a conductor film coated on the inner surface of the through hole when the through holes are halved by a mechanical cutting tool. Therefore, the pitch of the end-face halved through-holes 3 formed at each end face of the substrate becomes 0.4 mm to 0.8 mm. By cutting the substrate material and the conductor filled up in the through holes along a line tracing a center of the through holes by use of a die, the circuit substrate 1 having the end-face halved through-hole 3 can be obtained. Even if the substrate thickness is large, the circuit substrate can be cut out dependently upon the precision of the die.

The end-face halved through-holes 3 are provided for the purpose of electrically connecting between the conductors respectively formed on the upper surface and the lower surface of the circuit substrate 1, and therefore, it is not preferable that the conductor layer provided on the inside surface of the through hole is disconnected in the process of working the circuit substrate and assembling the package. In order to avoid this inconvenience, it is preferred to previously coat a portion or the whole of the surface of the through hole conductor film with the solder resist. In the prior art LCC type package, since the end-face through-hole electrodes were used as the external electrodes, it was necessary to ensure a solder wettability of the end-face through-hole electrode. In the present invention, however, it is no longer necessary to ensure the solder wettability of the end-face through-hole electrode since the end-face through-hole electrodes are not used as the external electrodes, and therefore, the inner surface of the through hole conductor film can be protected with a resin, in order to prevent disconnection of the through hole conductor film.

Figure 4:
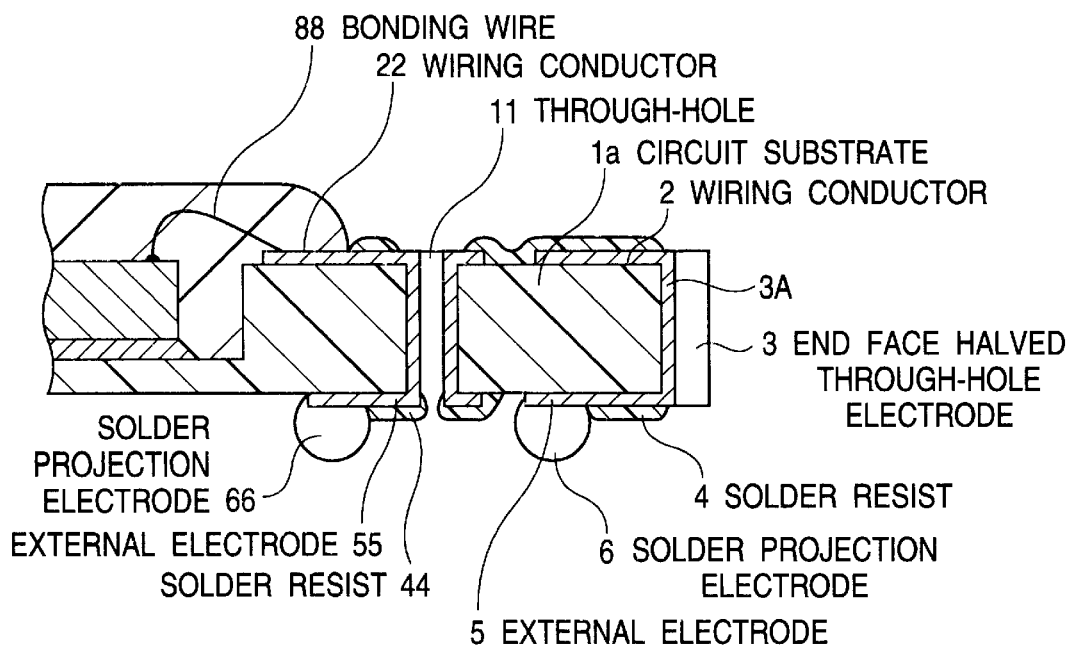
FIG. 4 is a diagrammatic partial sectional view of a second embodiment of the semiconductor device package in accordance with the present invention.

Referring to FIG. 4, there is shown a diagrammatic partial sectional view of a second embodiment of the semiconductor device package in accordance with the present invention. In FIG. 4, elements corresponding to those shown in FIG. 3 are given the same Reference Numerals, and explanation thereof will be omitted for simplification of the description.

As seen from comparison between FIGS. 3 and 4, the second embodiment is characterized in that a circuit substrate 1a further includes a plurality of inside-area through-holes 11 formed in the circuit substrate 1a other than the end face region of the circuit substrate, a plurality of additional wiring conductor 22 formed on the upper surface of the circuit substrate 1a and connected to an upper end of the inside-area through-holes 11 and connected to the semiconductor device chip 7 through bonding wire 88, a plurality of additional external electrode 55 formed on the lower surface of the circuit substrate 1 and connected to a lower end of the inside-area through-holes 11, and a solder resist 44 applied to cover the additional external electrode 55 between the lower end of the inside-area through hole 11 and an inner end of the additional external electrode 55, in order to separate between the lower end of the inside-area through hole 11 and an inner end of the additional external electrode 55. In this connection, a solder projection electrode 66 in the form of a bump can be formed on the inner end of the external electrode 55.

In the second embodiment, when the circuit substrate 1a is formed of a glass epoxy substrate having the thickness of 0.6 mm, the pitch of the end-face halved through-holes 3 formed on each end face of the circuit substrate 1a, can be made to 0.5 mm. Therefore, considering the package of 20 mm square, about 140 end-face halved through-holes 3 can be formed. In addition, assuming that the inside-area through holes 11 are located at a pitch of 1.27 mm to constitute a matrix of 12 rows and 12 columns, 144 inside-area through holes 11 can be formed. Therefore, 280 or more vias can be formed in total. Here, the pitch of 1.27 mm is required for ensuring that at least one conductor passes between adjacent inside-area through holes 11 to constitute a wiring circuit on or in the circuit substrate.

Here, considering that the vias are constituted of only the inside-area through holes 11, even if the inside-area through holes 11 are located at a pitch of 1.27 mm to constitute a matrix of 14 rows and 14 columns, only 196 vias for interconnecting between the conductors respectively formed on the upper surface and the lower surface of the circuit substrate can be formed. Therefore, by utilizing both the end-face halved through-holes 3 and the inside-area through holes 11, the number of formable vias can be remarkably increased, and therefore, the degree of freedom in design can be elevated. In addition, by halving the end-face through-holes, it is possible to remove or cut off the circuit board at the outside of the end-face halved through-holes, and therefore, the size of the package can be minimized. Particularly, this advantage becomes remarkable in a small-size package. If the pitch of the inside-area through holes 11 is made to 0.5 mm, it is no longer possible to cause a conductor to pass between adjacent inside-area through holes 11 because a spacing remaining between adjacent inside-area through holes 11 is too narrow. Therefore, an area of the circuit substrate at the outside of the end-face halved through-holes 3 located at the pitch of 0.5 mm, cannot be effectively utilized, namely, becomes an unnecessary space. Accordingly, even if the area of the circuit substrate at the outside of the end-face halved through-holes 3 is cut off, no functional problem occurs.

In order to halve the end-face through-holes, it is possible to use a precise die for cutting out the circuit substrate. When the circuit substrate is formed of a ceramic, if a break line is previously formed of a V-shaped groove, it becomes easy to cut out the circuit substrate.

Figure 5A:
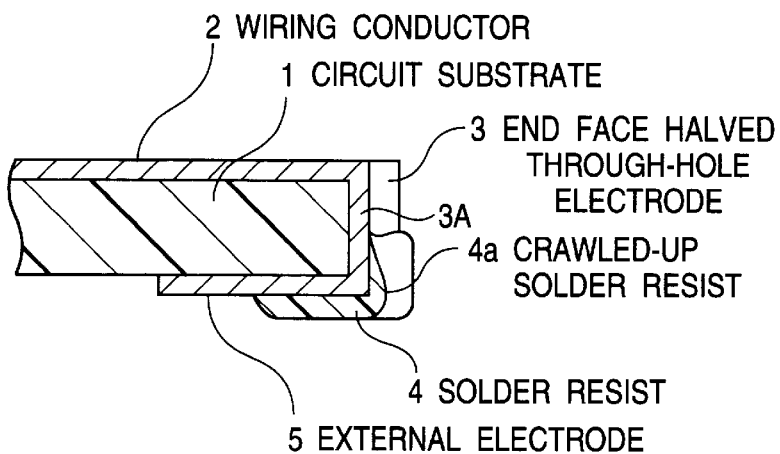
FIGS. 5A and 5B are diagrammatic partial sectional views illustrating the end-face halved through-hole of the semiconductor device package in accordance with the present invention.
Figure 5B:
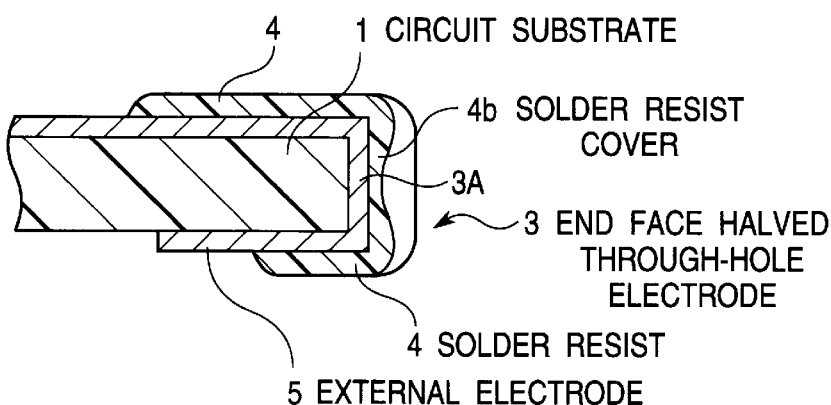

Referring to FIGS. 5A and 5B, there are diagrammatic partial sectional views illustrating the end-face halved through-hole of the semiconductor device package in accordance with the present invention. FIG. 5A illustrates the end-face halved through-hole 3 having a lower half coated with the solder resist, and FIG. 5B illustrates the end-face halved through-hole 3 having the whole surface coated with the solder resist.

A basic purpose of the provision of the solder resist 4 is to separate the external electrode 5 and the conductor film 3A formed on the inner side surface of the end-face halved through-hole 3 from each other by the solder resist 4 so as to prevent the external electrode 5 and the end-face halved through-hole conductor film 3A from being simultaneously wetted by the solder. Therefore, it is sufficient if the lower half of the end-face halved through-hole conductor film 3A is covered with a crawled-up solder resist 4a as shown in FIG. 5A. However, the whole surface of the end-face halved through-hole conductor film 3A can be more preferably completely covered with a solder resist cover 4b as shown in FIG. 5B. If the portion or the whole surface of the end-face halved through-hole conductor film 3A is covered with the solder resist 4, it becomes easy to cut out the circuit substrate along the through holes for the end-face halved through-holes 3, and simultaneously, an effect of protecting the conductor film exposed at the end face of the package can be obtained. The coating of the solder resist can be carried out by covering the through holes with the solder resist by use of a mask pattern, in the process of manufacturing the circuit substrate.

Now, a third embodiment of the semiconductor device package in accordance with the present invention will be described with reference to FIG. 6 which is a diagrammatic sectional view of the third embodiment.

The third embodiment of the semiconductor device package in accordance with the present invention uses a multi-level ceramic substrate 1b, which internally includes internal conductors 2b in the inside of the substrate, and has wiring conductors 2d, external electrodes 5b and end-face halved through-holes 3 provided on an outer surface of the substrate. A semiconductor device chip 7b is mounted on a cavity formed on a center region of an upper surface of the substrate 1b, and is electrically connected through bonding wires 8b to the wiring conductors 2d, and is also encapsulated with a resin 10b.

In a general practice, the multilevel ceramic substrate 1b is formed of a substrate material mainly composed of alumina (aluminum oxide) or aluminum nitride, and the internal conductors are formed of a refractory metal such as tungsten or molybdenum. However, a glass-ceramic formed by adding glass into alumina can be used.

Figure 6:
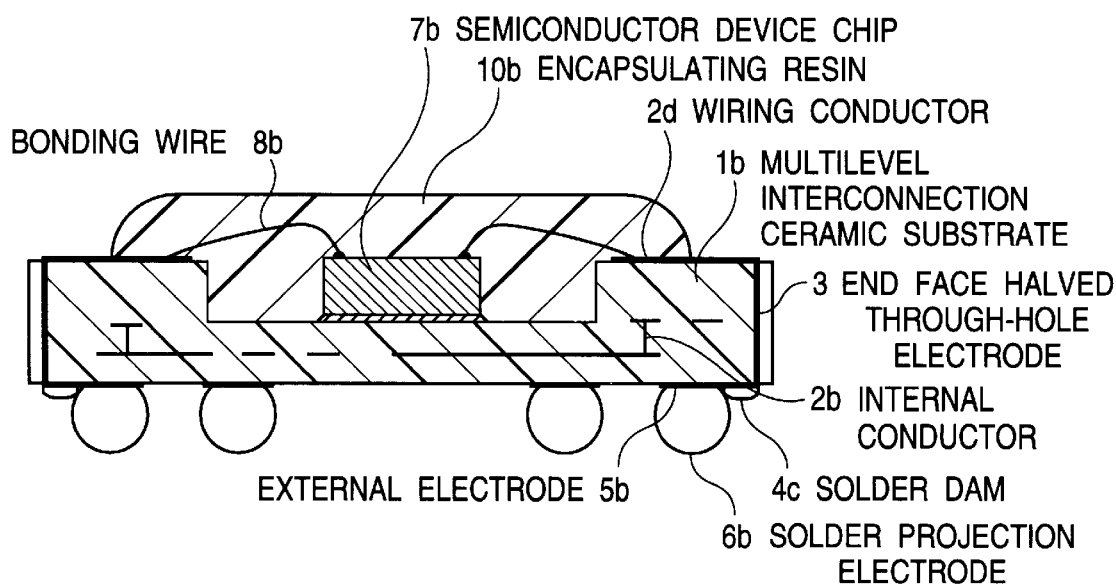
FIG. 6 is a diagrammatic sectional view of a third embodiment of the semiconductor device package in accordance with the present invention.

As shown in FIG. 6, a solder dam 4c is formed to separate the end-face halved through-hole 3 from an inner end of the external electrode 5b. The solder dam 4c can be formed by supplying a material similar to that of the ceramic substrate and then sintering the material, or alternatively by printing a patterned epoxy resin and then curing the patterned epoxy resin. The semiconductor device package thus formed can be mounted on for example a printed circuit board while maintaining the external conductors 5b in a flat conductor condition. However, the semiconductor device package can be mounted after previously forming a solder projection electrode 6b in the form of a bump on the external conductors 5b.

As seen from the above, in the semiconductor device package in accordance with the present invention, since a side surface of the end-face halved through-holes is not used as an electrically connecting external contact face, and since the external electrodes are formed on the other surface of the circuit substrate and connected to the end-face halved through-holes, and furthermore, since the circuit substrate at the outside of the end-face halved through-holes is cut off or removed, the package can be made small. In addition, since the vias are concentrated at the end-face of the substrate, an occupying area per one via becomes small, with the result that a space used for laying out the conductors within the same circuit substrate becomes large, and therefore, the degree of freedom in designing the conductor patter layout can be elevated.

In addition, if the end-face halved through-holes are provided at the end-face of the circuit substrate and the inside-area through holes are provided in an inside area of the circuit substrate, the number of vias can be remarkably increased.

Since the conductor protecting layer (solder resist) separates the end of the external electrodes from the end-face halved through-holes or the inside-area through-holes, the solder is prevented from crawling up. When end-face through holes are halved, if the end-face halved through-holes are coated with the conductor protecting layer, the halving working becomes good, and the end-face conductors are protected.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device package comprising a circuit substrate, at least one electronic component mounted on said circuit substrate, a plurality of end-face halved through-holes formed on an end-face of said circuit substrate, said plurality of end-face halved through holes each having a side surface coated with a conductor film, a plurality of wiring conductors formed on a first surface of said circuit substrate and connected to said end-face halved through-holes, a plurality of external electrodes formed on a second surface of said circuit substrate and connected to said end-face halved through-holes, and a conductor protecting layer provided to cover a region between an inner end of said external electrodes and said end-face halved through-holes for separating said inner end of said external electrodes from said end-face halved through-holes.

2. A semiconductor device package claimed in claim 1, further including a plurality of inside-area through-holes formed in an area of said circuit substrate other than an end face region of said circuit substrate, a plurality of additional external electrodes formed on the second surface of said circuit substrate to extend from said inside-area through-holes, and an additional conductor protecting layer provided to cover a region between an end of said additional external electrodes and said inside-area through-holes for separating said end of said additional external electrodes from said inside-area through-holes.

3. A semiconductor device package claimed in claim 1, wherein said conductor protecting layer extends to cover at least a portion of each of said end-face halved through-holes.

4. A semiconductor device package claimed in claim 1, wherein said conductor protecting layer extends to cover the whole surface of each of said end-face halved through-holes.

5. A semiconductor device package claimed in claim 1, wherein a bump solder electrode is formed on said end of each of said external electrodes.

6. A semiconductor device package claimed in claim 1, wherein said conductor protecting layer is formed of epoxy resin.

7. A semiconductor device package claimed in claim 2, wherein said conductor protecting layer extends to cover at least a portion of each of said end-face halved through-holes.

8. A semiconductor device package claimed in claim 2, wherein said conductor protecting layer extends to cover the whole surface of each of said end-face halved through-holes.

9. A semiconductor device package claimed in claim 2, wherein a bump solder electrode is formed on said end of each of said external electrodes.

10. A semiconductor device package claimed in claim 2, wherein said conductor protecting layer is formed of epoxy resin.

* * * * *